(12) United States Patent
Stellacci et al.

(10) Patent No.: US 7,862,849 B2
(45) Date of Patent: Jan. 4, 2011

(54) NANOCONTACT PRINTING

(75) Inventors: Francesco Stellacci, Somerville, MA (US); Arum Amy Yu, Cambridge, MA (US)

(73) Assignee: Massachusetts Institute of Technology, Cambridge, MA (US)

(*) Notice: Subject to any disclaimer, the term of this patent is extended or adjusted under 35 U.S.C. 154(b) by 1417 days.

(21) Appl. No.: 10/688,867

(22) Filed: Oct. 17, 2003

(65) Prior Publication Data

US 2006/0141245 A1 Jun. 29, 2006

(51) Int. Cl.
G01N 1/31 (2006.01)
(52) U.S. Cl. .................. 427/2.13; 436/518; 536/23.1; 536/24.3; 427/2.11; 427/466
(58) Field of Classification Search .................. None
See application file for complete search history.

(56) References Cited

U.S. PATENT DOCUMENTS

| | | | |
|---|---|---|---|
| 5,079,600 A | 1/1992 | Schnur | |
| 5,512,131 A | 4/1996 | Kumar | |
| 5,772,905 A | 6/1998 | Chou | |
| 6,020,047 A | 2/2000 | Everhart | |
| 6,114,099 A | 9/2000 | Liu | |
| 6,309,580 B1 | 10/2001 | Chou | |
| 6,444,321 B1 | 9/2002 | Arnebrandt | |
| 6,514,768 B1* | 2/2003 | Guire et al. | 436/518 |
| 2001/0023024 A1* | 9/2001 | Aksay et al. | 428/425.5 |
| 2002/0015800 A1* | 2/2002 | Miyamoto et al. | 427/553 |
| 2002/0127732 A1* | 9/2002 | Nowak et al. | 436/128 |
| 2002/0164604 A1 | 11/2002 | Abbott | |
| 2002/0167117 A1 | 11/2002 | Chou | |
| 2003/0022169 A1* | 1/2003 | Mirkin et al. | 435/6 |
| 2003/0034329 A1 | 2/2003 | Chou | |
| 2003/0068446 A1 | 4/2003 | Mirkin | |
| 2003/0080471 A1 | 5/2003 | Chou | |
| 2003/0080472 A1 | 5/2003 | Chou | |
| 2003/0108913 A1* | 6/2003 | Schouten | 435/6 |
| 2003/0148304 A1* | 8/2003 | Liang et al. | 435/6 |
| 2004/0106140 A1* | 6/2004 | Thill | 435/6 |

OTHER PUBLICATIONS

Pellicciari et al., Methods of denaturation and renaturation of DNA in interphasic chromatin: cytochemical quantitative analysis by methyl green staining, 1978, Histochem Journal, 10: pp. 213-222.*

Amro, et al., "Patterning Surfaces Using Tip-Directed Displacement and Self-Assembly", *Langmuir*, 16: 3006-3009, 2000.

Andre, et al., "Quantum Chemistry and Molecular Engineering of Oligomeric and Polymeric Materials for Optoeletronics", *Chem. Rev.* 91: 843-865, 1991.

(Continued)

*Primary Examiner*—N Yang
(74) *Attorney, Agent, or Firm*—Pearl Cohen Zedek Latzer, LLP; Mark S. Cohen

(57) ABSTRACT

A method of stamping of molecular patterns and/or devices based on the reversible self-assembly of molecules, particularly organic molecules is disclosed. This method is suitable for the stamping of almost any nanofabricated device and can be used to transferring a large amount of pattern information from one substrate to another at the same time.

12 Claims, 4 Drawing Sheets

OTHER PUBLICATIONS

Austin, et al., "Fabrication of Nanocontacts for Molecular Devices Using Nanoimprint Lithography", *J. Vac. Sci. Technol.* 20(2): 665-667, 2002.

Bashir, et al., "DNA-Mediated Artificial Nanobiostructures: State of the Art and Future Directions", *Superlattices and Microstructures*, 29(1): 1-16, 2001.

Bruckbauer, et al., "Writing with DNA and Protein Using a Nanopipet for Controlled Delivery", *J. Am. Chem. Soc.* 124: 8810-8811, 2002.

Chappert, et al., "Planar Patterned Magnetic Media Obtained by Ion Irradiation", *Science*, 280: 1919-1922, 1998.

Chen, et al., "Nanofabrication: Conventional and Nonconventional Methods", *Electrophoresis*, 22: 187-207, 2001.

Chou, et al., "Ultrafast and Direct Imprint of Nanostructures in Silicon", *Nature*, 417: 835-837, 2002.

Demers, et al., "Orthogonal Assembly of Nanoparticle Building Blocks and Dip-Pen Nanolithographically Generated Templates of DNA", *Angew. Chem. Int. Ed.* 40: 3071-3073, 2001.

Demers, et al., "Direct Patterning of Modified Oligonucleotides on Metals and Insulators by Dip-Pen Nanolithography", Science, 296: 1836-1838, 2002.

Demers, et al., "Combinatorial Templates Generated by Dip-Pen Nanolithography for the Formation of Two-Dimensional Particle Arrays", *Angew. Chem. Int. Ed.* 40(16): 3069-3071, 2001.

Folkers, et al., "Phase Behavior of Two-Component Self-Assembled Monolayers of Alkanethiolates on Gold", *J. Phys. Chem.* 98: 563-571, 1994.

Fuierer, et al., "Patterning Mesoscale Gradient Structures with Self-Assembled Monolayers and Scanning Tunneling Microscropy Based Replacement Lithography", *Adv. Mater.* 14(2): 154-157, 2002.

Gonsalves, et al., "Organic-Inorganic Nanocomposites: Unique Resists for Nanolithography", *Adv. Mater.* 13(10): 703-714, 2001.

Gorman, et al., "Chemically Well-Defined Lithography Using Self-Assembled Monolayers and Scanning Tunneling Microscopy in Nonpolar Organothiol Solutions", *Langmuir*, 16: 6312-6316, 2000.

Hanvey, et al., "Antisense and Antigene Properties of Peptide Nucleic Acids", *Science*, 258: 1481-1485, 1992.

Heller, et al., "DNA Microarray Technology: Devices, Systems, and Applications", *Annu. Rev. Biomed. Eng.* 4: 129-153, 2002.

Hoeppener, et al., "Metal Nanoparticles, Nanowires, and Contact Electrodes Self-Assembled on Patterned Monolayer Templates—A Bottom-up Chemical Approach", *Adv. Mater.* 14: 1036-1041, 2002.

Hong, et al., "Multiple Ink Nanolithography: Toward a Multiple-Pen Nano-Plotter", *Science*, 286: 523-525, 1999.

Joachim, et al., "Is There a Minimum Size and a Maximum Speed for a Nanoscale Amplifier?" *Annals. NYAS Online*, 852: 243-256, 1998.

Johnson, et al., "Ordered Mesoporous Polymers of Tunable Pore Size from Colloidal Silica Templates", *Science*, 283: 963-965, 1999.

Lee, et al., "Protein Nanoarrays Generated by Dip-Pen Nanolithography", *Science*, 295: 1702-1705, 2002.

Liu, et al., "Production of Nanostructures of DNA on Surfaces", *NANO Letters*, 2(8): 863-867, 2002.

Liu, et al., "Three-Dimensional Nanostructure Construction via Nanografting: Positive and Negative Pattern Transfer", *NANO Letters*, 2(9): 937-940, 2002.

Liu, et al., "Nanofabrication of Self-Assembled Monolayers Using Scanning Probe Lithography", *Acc. Chem. Res.* 33: 457-466, 2000.

Maoz, et al., "Constructive Nanolithography", Inert Monolayers as Patternable Templates for In-Situ Nanofabrication of Metal—Semiconductor—Organic Surface Structures—A Generic Approach, *Adv. Mater.* 12(10): 725-731, 2000.

Maynor, et al., "Au "Ink" for AFM "Dip-Pen" Nanolithography", *Langmuir*, 17: 2575-2578, 2001.

Melosh, et al., "Ultrahigh-Density Nanowire Lattices and Circuits", *Science*, 300: 112-115, 2003.

Nyffenegger, et al., "Nanometer-Scale Surface Modification Using the Scanning Probe Microscope: Progress Since 1991", *Chem. Rev.* 97: 1195-1230, 1997.

Park, et al., "Array-Based Electrical Detection of DNA with Nanoparticle Probes", *Science*, 295: 1503-1506, 2002.

Piner, et al., "Dip-Pen Nanolithography", *Science*, 283: 661-663, 1999.

Schwartz, et al., "Molecular Transport from an Atomic Force Microscope Tip: A Comparative Study of Dip-Pen Nanolithography", *Langmuir*, 18: 4041-4046, 2002.

Stutzmann, et al., "Self-Alligned, Vertical-Channel, Polymer Field-Effect Transistors", *Science*, 299: 1881-1884, 2003.

Sun, et al., "Nanoscale Molecular Patterns Fabricated by Using Scanning Near-Field Optical Lithography", *J. Am. Chem. Soc.*, 124(11): 2414-2415, 2002.

Taton, et al., "The DNA-Mediated Formation of Supramolecular Mono-and Multilayered Nanoparticle Structures", *J. Am. Chem. Soc.* 122: 6305-6306, 2000.

Taton, et al., "Scanometric DNA Array Detection with Nanoparticle Probes", *Science*, 289: 1757-1760, 2000.

Taton, et al., "Two-Color Labeling of Oligonucleotide Arrays via Size-Selective Scattering of Nanoparticle Probes", *J. Am. Chem. Soc.* 123: 5164-5165, 2001.

Watterson, et al., "Practical Physical Aspects of Interfacial Nucleic Acid Oligomer Hybridisation for Biosensor Design", *Analytica Chimica Acta*, 469: 115-127, 2002.

Xia, et al., "Unconventional Methods for Fabricating and Patterning Nanostructures", *Chem. Rev.* 99: 1823-1848, 1999.

Xia, et al., "Soft Lithography", *Annu. Rev. Mater. Sci.*, 28: 153-184, 1998.

Mirkin et al., "A DNA-based method for rationally assembling nanoparticles into macroscopic materials", Nature, vol. 382, Aug. 15, 1996, pp. 607-609.

Gooding et al., "Self-assembled monolayers into the $21^{st}$ century: Recent advances and application", Electroanalysis 2003, vol. 15, No. 2, pp. 81-96.

Falconnet et al., "A novel approach to produce protein nanopatterns by combining nanoimprint lithography and molecular self-assembly", Nano Letters 2004, vol. 4, No. 10, pp. 1909-1914.

* cited by examiner

A

B

NANOCONTACT PRINTING

GOVERNMENT INTEREST STATEMENT

This invention was made in whole or in part with government support under grant number DMI-0303821, awarded by the National Science Foundation. The government may have certain rights in the invention.

BACKGROUND

In recent years, there has been considerable effort aimed at understanding new phenomena in the nanoscale, a diversity of new nanostructured materials have been fabricated and characterized. New devices with intriguing properties are just beginning to be engineered. The expectations for a new generation of cheap and innovative tools that will change our lives are very high. The combination of a new set of expected and unexpected properties together with a whole new family of materials and fabrication methods will enable devices that we could not even have conceived just ten years ago. Coulomb blockade in metal nanoparticles as well as in semiconductor quantum dots, narrow band fluorescence emission from semiconductor nanoparticles, quantized ballistic conduction in nanowires and nanotubes: these are just a few new materials/phenomena that will have an impact on the way we design optical and electronics devices. For a review of nanodevices and fabrication techniques, see Bashir, *Superlattice and Microstructures* (2001), 29(1):1-16; Xia, et al., *Chem. Rev.* (1999), 99:1823-1848; and Gonsalves, et al., *Advanced Materials* (2001), 13(10):703-714, the entire teachings of which are incorporated herein by reference.

Nanoscience development, similarly to many other branches of science, but probably in a more extreme way, relies on state-of the-art techniques for the imaging and fabrication of its tools. Undoubtedly, the development of the transmission electron microscope (TEM) and scanning tunneling microscope (STM) gave birth to the whole field of nanoscience. While the development of electron-beam (e-beam) lithography, being the first tool that could build structure and devices in the nanometer scale, made the field of nanotechnology a reality.

The first stages of nanoscience and mainly of nanotechnology have been dominated by the development and characterization of new materials and devices based on inorganic semiconductors and metals. One of the main reasons for this is that e-beam lithography is a technique to pattern inorganic materials on an inorganic substrate. A significant advancement in recent years has been the development of novel highly versatile nanolithographies based on scanning probe microscopes (SPM). Using various types of SPMs a wide variety of organic and inorganic substrates can now be patterned either by inducing localized chemical modifications or by forming self-assembled monolayers (SAMs). For example, Mirkin and coworkers have developed an atomic force microscope (AFM)-based technique (Dip Pen Nanolithography, DPN) in which a SAM can be generated by controlled transfer of molecules from the microscope tip to a substrate, with resolution below 5 nm (see Lee, et al., *Science* (2002), 295:1702-1705; Demers, et al., *Angew. Chem. Int. Ed.* (2001), 40(16): 3069-3071; Hong, et al., *Science* (1999), 286:523-525; Piner, et al., *Science* (1999), 283:661-663; Demers, et al., *Angew. Chem. Int. Ed.* (2001), 40(16):3071-3073; Demers, et al., *Science* (2002), 296:1836-1838, U.S. Patent Application Publication Nos. 2002/0063212, 2003/0049381, 2003/0068446, and 2003/0157254, the entire teachings of which are incorporated herein by reference). The development of such techniques represents a major breakthrough, as now it is possible to build devices based not only on inorganic but also on organic and biomaterials. Organic based nanomaterials are likely to offer a number of interesting properties that can be effectively modulated on the nanoscale. Furthermore, the typical disadvantages of organic materials are less important in nanodevices; for example, there is less need for good mechanical properties or high thermal stability. Thanks both to these novel fabrication techniques and to the elucidation of basic concepts in surface and supra-molecular chemistry, novel devices are currently well under development.

Using organic and inorganic based nano-lithography techniques many different nano-devices (e.g nano-transistors, nano-sensors and nano-waveguides) are presently being fabricated. However, in order to predict how great an impact nanotechnology will have, one must estimate the speed of fabrication for complex devices. Unfortunately, all nano-lithographies have in common the same drawback: they are extremely slow, and it has been postulated that device fabrication time (and reproducibility) will be the main limiting factor in nanotechnology. In particular, the problem of how to scale up production has not been solved. Addressing the problem of production scale-up is critical if we hope to see the enormous amount of knowledge that we are now acquiring translated into transistors, sensors, antennas, lenses and drug delivery systems to use in everyday life.

It would be desirable for nanotechnology to have an equivalent of micro-contact printing: this stamping technique engineered by Whitesides and coworkers (see U.S. Pat. Nos. 5,512,131, 5,900,160, 6,048,623, 6,180,239, 6,322,979, 6,518,168, the entire teachings of which are incorporated herein by reference) has revolutionized the way people design micro-devices and has had an enormous impact in allowing non-chemist to build devices as complex as bio-MEMS. Unfortunately, micro-contact printing has serious resolution limitations, so its application in nanotechnology is limited.

The only research efforts to directly address this problem is that by Chou and coworkers at Princeton. In a recent Hewlett Packard press release ("breakthrough in nano-electronics"), their patents and patent applications on nano-imprinting (U.S. Pat. Nos. 5,772,905 and 6,309,580, and U.S. Patent Application Publication Nos. 2002/0167117, 2003/0034329, 2003/0080471, and 2003/0080472, the entire teachings of which are incorporated herein by reference) were considered one of the fundamental steps towards the realization of nano-transistors. The method is based on a hard mold (i.e., a mold made of an inorganic material) that is stamped on a soft polymer film overcoating a silicon wafer. The printed substrates typically consist of metallic wires or semiconductor materials (see Chou, et al., *Nature* (2002), 417:835-837; and Austin, et al., *J. Vac. Sci. Technol. B* (2002), 20(2):665-667, the entire teachings of which are incorporated herein by reference). As with many other fundamental aspects of nanotechnology, the fabrication methods for inorganic materials are preceding those for organic materials. In fact, the main limitations to nano-imprint is that it needs a "hard" mold and that it is tailor-made to print a shape on a silicon wafer. It is difficult to envision how such a method could be adapted for soft molds (i.e., a mold made of an organic material) and/or how it could be used to transfer the high degree of complexity and information that an organic (particularly a bio-organic) substrate can carry.

A major drawback of existing nanolithography techniques for fabricating nanoscale devices is that features of the device must be fabricated in a series of steps. Thus, these techniques are limited to relatively simple devices since the fabrication of devices having many features would take a prohibitive amount of time. The only major effort to address this problem is the fabrication of multi-tip arrays for SPMs (Zhang, et al., *Nanotechnology* (2002), 13:212, the entire teachings of which are incorporated herein by reference). While such approaches will mainly enable the parallel fabrication of a perhaps tens or hundreds of nano-devices, it would be desirable to develop a nanoscale stamping technique that could complement such parallel device production, and move it toward mass-production by developing a method that can produce many features in a parallel manner on a device in a single processing step.

SUMMARY OF THE INVENTION

The method of the invention allows multiple features of a nanoscale devices to be fabricated at the same time. In one aspect of the invention, the method involves forming a complement image of a master. The master used in this embodiment of the method of the invention comprises a first set of molecules bound to a first substrate to form a pattern. The master is contacted with a second set of molecules that assembling via attractive forces or via bond formation on the first set of molecules. Each molecule in the second set of molecules comprises a reactive functional group and a recognition component that is attracted to or binds to at least a portion of one or more of the first set of molecules. The reactive functional group of the second set of molecules is then contacted with a surface of a second substrate. The surface of the second substrate reacts with the reactive functional group of the second set of molecules to form a bond between the second set of molecules and the second substrate. The attractive force between the first set of molecules and the second set of molecules is then broken, and the second set of molecules bound to the second substrate forms a complement image of the master. Once the master has been separated from the complement image by breaking the bonds between the first and the second set of molecules, the master can be reused one or more times to form additional complement images.

In another aspect of the invention, the method involves forming a reproduction of a master, or a portion thereof. The master used in this embodiment of the method of the invention comprises a first set of molecules bound to a first substrate to form a pattern. A second set of molecules is assembled on the first set of molecules via bond formation. The second set of molecules comprises a reactive functional group and a recognition component that binds to at least a portion of one or more molecules from the first set of molecules. The reactive functional group of the second set of molecules is then contacted with a surface of a second substrate. The reactive functional group reacts with the surface of the second substrate to form a bond between the second set of molecules and the second substrate. The bonds between the first set of molecules and the second set of molecules are then broken, and the second set of molecules bound to the second substrate forms a complement image of the master. A third set of molecules is then assembled via bond formation on the second set of molecules of the complement image. Each molecule in the third set of molecules comprises a reactive functional group, and a recognition component that binds to the second set of molecules. The reactive functional group of the third set of molecules is then contacted with a surface of a third substrate. The surface of the third substrate reacts with the reactive functional group of the third set of molecules to form a bond between the third set of molecules and the third substrate. The bonds between the second set of molecules and the third set of molecules are then broken, and the third set of molecules bound to the third substrate form a reproduction of the pattern, or portion thereof, of the master. Once the complement image has been separated from the reproduction, the complement image can be reused one or more times to form additional reproductions.

In another aspect, the invention relates to a composition comprising a master having a pattern of a first set of molecules bound to a first substrate; and a complement image comprising a pattern of a second set of molecules bound to a second substrate via a reactive functional group on each molecule of the second set of molecules. In this aspect of the invention, each molecule in the second set of molecules has a recognition component that binds to at least a portion of a molecule from the first set of molecule.

In another aspect, the invention relates to a composition, comprising a first pattern of a first set of molecules bound to a first substrate; and a second pattern of a second set of molecules bound to a second substrate via a reactive functional group on each molecule of the second set of molecules. In this aspect of the invention, each molecule of the second set of molecules comprises a recognition component that binds to at least one molecule in the first set of molecules, and the second pattern is a complement image of the first pattern.

In another aspect, the invention relates to a composition, comprising a first pattern of a first set of molecules bound to a first substrate; and a second substrate, wherein the second substrate comprises a degraded portion and an undegraded portion, and the undegraded portion is a complement image of the first pattern.

In another aspect, the invention relates to a composition, comprising a first pattern of a first set of molecules bound to a first substrate; and a second substrate having a patterned layer of a material deposited thereon, wherein the patterned layer of deposited material on the second substrate is a complement image of the first pattern.

In another aspect, the invention relates to a kit for printing a molecular pattern on a substrate. The kit comprises a master comprising a pattern of a first set of molecules bound to a substrate; and a second set of molecules. The second set of molecules comprises a reactive functional group; and a recognition component that binds to the first set of molecules.

In another aspect, the invention relates to a molecular printer for generating a complement image of a master, wherein the master has a first set of molecules bound to a first substrate. The molecular printer comprises a device for delivering a solution of a second set of molecules to a surface of the master, and a device for contacting the second set of molecules with a second substrate. In this embodiment, the second set of molecules comprises a reactive functional group; and a recognition component that binds to the first set of molecules.

The method of the invention complements all the chemically oriented nanolithography techniques that have been developed in recent years and which generally require complex instrumentation. For example, it has already been shown that DNA testing arrays can be fabricated using Dip Pen Nanolithography. Once the master for these devices is built, the method of the invention, that does not require complex instrumentation and materials, can be used to print a large number of cheap and extremely sensitive devices for the detection of, for example, biohazards. By way of example, let's assume that such a device covers an area of 1 $mm^2$. From a single mold built on a silicon wafer (~$10^6$ $mm^2$), one million sensors for a specific bio-molecule (such as anthrax) could be fabricated in approximately 3 hours using the method of the invention. Because the transfer process is self-assembly based, all the steps, besides the fabrication of the master, can be done in parallel over very large areas and on multiple substrates.

The amount of information stored in a molecule, such as a DNA strand, can be enormous. The method of the invention has the possibility of transferring this information in a massively parallel way (i.e., in one or only a few step instead of many steps). Thus devices that are now built using multi-step techniques could be fabricated in a single step. This opportunity will redirect research and device manufacture towards increasing complexity in fabricated substrates. As a simple example, if a master were fabricated on a 1 mm² substrate having a series of nano and microfluidic channels (e.g., 50) having 50 different types of DNA strands defining the walls of the channels, in one single printing step with the method of the invention, one could fabricate on a 1 mm² substrate a complement image of the series of nano and microfluidic channels, each with the wall functionalized in a different way: a real lab on a chip. This is not possible with any current fabrication method, which would require 50 consecutive steps.

A unique feature of the method of the invention is the ability to copy, and thus replicate, the master itself using the parallel method of the invention instead of the methods of the prior art in which printed items cannot act as a master. This is a major advantage over any existing methods. In fact, typically for large production lines many masters are needed. This, combined with the wearing of existing molds, means that a constant production of masters is required. In the method of the invention, once a master is produced, reproductions of the master can be produced from it, and these new master will then be used to print the final devices. Reproducibility should be improved and, more importantly the instruments for the primary master fabrication which produce features in a serial fashion will have to be used only to fabricate the primary master.

The method of the invention is revolutionary not only because it can be used to print organic SAMs, but because the method can be used to transfer multiple types of information (e.g., chemical+shape) and to reproduce a master in a parallel fashion.

BRIEF DESCRIPTION OF THE DRAWING

The invention is described with reference to a particular embodiment shown in the figures. The embodiment in the figures is shown by way of example and is not meant to be limiting in any way.

DEFINITIONS

Figure 1:
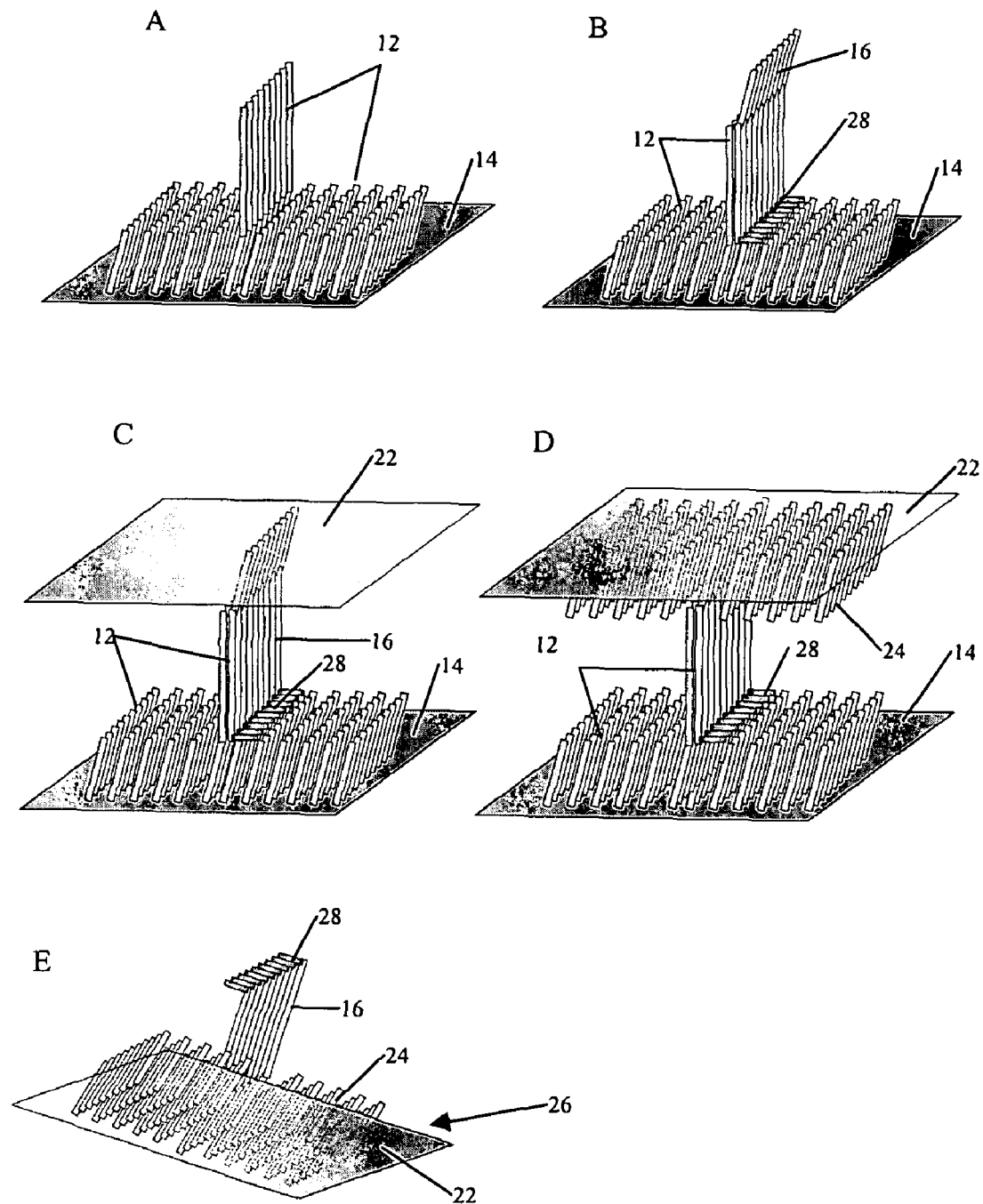
FIGS. 1A-E are a schematic representation of one embodiment of the method of the invention for producing a complement image.

A "master," as used herein, is a substrate that has a first set of molecules bound to a surface of the substrate in a random or non-random pattern. Preferably, the first set of molecules are bound to the master in a non-random pattern. The first set of molecules may include one or more different molecules. The information encoded in the pattern may be from the position of each of the molecules on the surface of the substrate and/or the chemical nature of the molecule (e.g., a molecule from the first set of molecules having a particular nucleic acid sequence will bind specifically to a nucleic acid molecule having a complementary sequence).

A "complement image of a master," as used herein, is an image on a substrate that is a mirror image, when the pattern on the master is asymmetrical, or a copy, when the pattern on the master is symmetrical, of the spatial and/or chemical information encoded in the master, or a portion thereof. In one embodiment, the complement image is formed by binding a second set of molecules to a second substrate. For example, if the first set of molecules bound to the master are nucleic acid molecules that form a non-centrosymmetric pattern, a complement image of the master will be a mirror image of the master formed on a second substrate with a second set of molecules that are nucleic acids that have a sequence that is complementary to at least a portion of a nucleic acid sequence from the first set of molecules. Typically, the chemical information transferred to the complement image is not identical to the information on the master but is enough information to allow at least a portion of the information from the master to be reproduced. For example, when the first and second sets of molecules are nucleic acid molecules, at least three or more consecutive bases of a molecule from the first set of molecules must be complementary three or more consecutive bases from the second set of molecules. A complement image can be formed from a portion of the pattern on the master by selecting molecules for the second set of molecules that only bind to a portion of the molecules of the first set of molecules that are bound to the master. When the second set of molecules binds only to a portion of the first set of molecule, the height profile of the complement image may have two or more levels. In addition, a complement image may encode only a mirror image of the spatial information encoded in the master or may encode both the chemical and spatial information encoded in the master. For example, if the first set of molecules bound to the master are nucleic acid molecules that form an asymmetric pattern, a complement image of the master will be a mirror image of the master formed on a second substrate with a second set of molecules that are nucleic acids that have a sequence that is complementary to at least a portion of a nucleic acid sequence from the first set of molecules. In this example, both spatial and chemical information are transferred from the master to the complement image. Furthermore, only a portion of the chemical information may be transferred to the complement image. For example, when the first set of molecules on the master are nucleic acid molecules, the second set of molecules that form the complement image may be nucleic acid sequences that are complementary to only a portion of a nucleic acid sequence on the master (i.e., is not complementary to the whole sequence).

A "reproduction of a master," as used herein, is copy of the spatial and/or chemical information encoded in a pattern of a master. The reproduction may be a copy of only a portion of the pattern of the master or may be a copy of the entire pattern of the master. In addition, a reproduction of a master may copy only the spatial information of the master or may copy both the spatial and chemical information encoded in the master. In addition, a reproduction of a master may reproduce only part of the chemical information.

"Chemical information encoded in a molecule" refers to the ability of the molecule to bind specifically to another molecule or to a specific type of molecule, typically, in a specific conformation. For example, a particular nucleic acid sequence binds specifically to a complementary sequence; or protein A binds specifically to immunoglobulins.

The term "pattern," as used herein, refers to the spatial location of each molecule in a set of molecules bound to a substrate, and the chemical structure of each molecule in the set of molecules.

The term "reactive functional group," as used herein, is a group that can react to form a bond with a surface of a substrate. Examples of reactive functional groups include thiol groups or a protected thiol group, which can bind to surfaces made of gold, silver, copper, cadmium, zinc, palladium, platinum, mercury, lead, iron, chromium, manganese, tungsten, or any alloys thereof. Protected thiol groups can be deprotected before they can bind to the substrate surface. Methods of protecting and deprotecting thiol groups can be found in Greene and Wuts, "Protective Groups in Organic Synthesis", John Wiley & Sons (1991), the entire teachings of which are incorporated into this application by reference. Another example of reactive functional groups is a silane or a chlorosilane, which can bind to a surface of doped or undoped silicon. Another example of a reactive functional group is a carboxylic acid, which can bind to a surface that is an oxide, such as silica, alumina, quartz, or glass. Another example of reactive functional groups are nitrites and isonitriles, which can bind to a surface of platinum, palladium or any alloy thereof. Another example of a reactive functional group is a hydroxamic acid, which can bind to a copper surface.

When a set of molecules binds to the surface of a substrate, the molecules will fold or stack against one another such that a portion of the molecule will be exposed on the surface of the substrate. The exposed functionality may be hydrophobic, hydrophilic, or an amphipathic functionality. In addition, the exposed functionality may be a functionality that selectively binds various biological or other chemical species such as proteins, antibodies, antigens, sugars and other carbohydrates, and the like. The exposed functionality may comprise a member of any specific or non-specific binding pair, such as either member of the following non-limiting list: antibody/antigen, antibody/hapten, enzyme/substrate, enzyme/inhibitor, enzyme/cofactor, binding protein/substrate, carrier protein/substrate, lectin/carbohydrate, receptor/hormone, receptor/effector, complementary strands of nucleic acid, repressor/inducer, or the like. Examples of exposed functionalities include —OH, —CONH—, —CONHCO—, —NH$_2$, —NH—, —COOH, —COOR, —CSNH—, —NO$_2^-$, —SO$_2$, —SH, —RCOR—, —RCSR—, —RSR, —ROR—, —PO$_4^{-3}$, —OSO$_3^{-2}$, —SO$_3^-$, —COO$^-$, —SOO$^-$, —RSOR—, —CONR$_2$, —(OCH$_2$CH$_2$)$_n$OH (where n=1-20, preferably 1-8), —CH$_3$, —PO$_3$H$^-$, —2-imidazole, —N(CH$_3$)$_2$, —N(R)$_2$, —PO$_3$H$_2$, —CN, —(CF$_2$)$_n$CF$_3$ (where n=1-20, preferably 1-8), and an olefin. R is hydrogen, a hydrocarbon, a halogenated hydrocarbon, a protein, an enzyme, a carbohydrates, a lectin, a hormone, a receptor, an antigen, an antibody, or a hapten.

The term "silane," as used herein, refers to a functional group having the following structural formula:

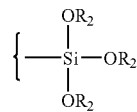

R$_2$ in the above structural formula, for each occurrence, is independently selected from the group consisting of —H, an alkyl, an aryl, an alkenyl, an alkynyl, and an arylalkyl.

The term "chlorosilane," as used herein, refers to a functional group having the following structural formula:

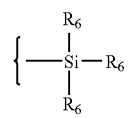

R$_6$ is the above structural formula, for each occurrence, is independly selected from —Cl or —OR$_2$, provided that at least one of R$_6$ is —Cl. Preferably, each R$_6$ is —Cl.

The term "spacer," as used herein, refers to a divalent group that connects two components of a molecule. Preferred spacers include alkylene, a heteroalkylene, a heterocycloalkylene, an alkenylene, an alkynylene, an arylene, a heteroarylene, an arylalkylene, and a heteroarylalkylene, wherein the alkylene, heteroalkylene, heterocycloalkylene, alkenylene, alkynylene, arylene, heteroarylene, arylalkylene, or heteroarylalkylene may be substituted or unsubstituted.

The term "alkyl," as used herein, means a straight chained or branched C$_1$-C$_{20}$ hydrocarbon or a cyclic C$_3$-C$_{20}$ hydrocarbon that is completely saturated. Alkyl groups may be substituted or unsubstituted.

The term "alkylene" refers to an alkyl group that has at least two points of attachment to at least two moieties (e.g., methylene, ethylene, isopropylene, etc.). Alkylene groups may be substituted or unsubstituted.

"Alkenyl groups" are straight chained or branched C$_2$-C$_{20}$ hydrocarbon or a cyclic C$_3$-C$_{20}$ hydrocarbon that have one or more double bonds. Alkenyl groups may be substituted or unsubstituted.

An "alkenylene" refers to an alkenyl group that has two points of attachment to at least two moieties. Alkenylene groups may be substituted or unsubstituted.

"Alkynyl groups" are straight chained or branched C$_2$-C$_{20}$ hydrocarbon or a cyclic C$_3$-C$_{20}$ hydrocarbon that have one or more triple bonds. Alkynyl groups may be substituted or unsubstituted.

An "alkynylene" refers to an alkynyl group that has two points of attachment to at least two moieties. Alkynylene groups may be substituted or unsubstituted.

An "heteroalkylene" refers to a group having the formula —X-{(alkylene)-X}$_q$—, wherein X is —O—, —NR$_1$—, or —S—; and q is an integer form 1 to 10. R$_1$ is a hydrogen, alkyl, aryl, arylalkyl, alkenyl, alkynyl, heteroaryl, heteroarylalkyl, or heterocycloalkyl. Heteroalkylene groups may be substituted or unsubstituted.

The term "aryl," as used herein, either alone or as part of another moiety (e.g., arylalkyl, etc.), refers to carbocyclic aromatic groups such as phenyl. Aryl groups also include fused polycyclic aromatic ring systems in which a carbocyclic aromatic ring is fused to another carbocyclic aromatic ring (e.g., 1-naphthyl, 2-naphthyl, 1-anthracyl, 2-anthracyl, etc.) or in which a carbocyclic aromatic ring is fused to one or more carbocyclic non-aromatic rings (e.g., tetrahydronaphthylene, indan, etc.). The point of attachment of an arylene fused to a carbocyclic, non-aromatic ring may be on either the aromatic, non-aromatic ring. Aryl groups may be substituted or unsubstituted.

An "arylene" refers to an aryl group that has at least two points of attachment to at least two moieties (e.g., phenylene, etc.). Arylene groups may be substituted or unsubstituted.

An "arylalkyl" group refers to an aryl group that is attached to another moiety via an alkylene linker. Arylalkyl groups may be substituted or unsubstituted. When an arylalkylene is substituted, the substituents may be on either the aromatic ring or the alkylene portion of the arylalkyl.

An "arylalkylene group," as used herein, refers to an arylalkyl group that has at least two points of attachment to at least two moieties. The second points of attachment can be on either the aromatic ring or the alkylene. An arylalkylene may be substituted or unsubstituted. When an arylalkylene is substituted, the substituents may be on either the aromatic ring or the alkylene portion of the arylalkylene.

The term "heteroaryl," as used herein, means an aromatic heterocycle which contains 1, 2, 3 or 4 heteroatoms selected from nitrogen, sulfur or oxygen. A heteroaryl may be fused to one or two rings, such as a cycloalkyl, a heterocycloalkyl, an aryl, or a heteroaryl. The point of attachment of a heteroaryl to a molecule may be on the heteroaryl, cycloalkyl, heterocycloalkyl or aryl ring, and the heteroaryl group may be attached through carbon or a heteroatom. Examples of heteroaryl groups include imidazolyl, furyl, pyrrolyl, thienyl, oxazolyl, thiazolyl, isoxazolyl, thiadiazolyl, oxadiazolyl, pyridinyl, pyrimidyl, pyrazinyl, pyridazinyl, quinolyl, isoquniolyl, indazolyl, benzoxazolyl, benzofuryl, benzothiazolyl, indolizinyl, imidazopyridinyl, pyrazolyl, triazolyl, isothiazolyl, oxazolyl, tetrazolyl, benzimidazolyl, benzoxazolyl, benzothiazolyl, benzothiadiazolyl, benzoxadiazolyl, indolyl, tetrahydroindolyl, azaindolyl, imidazopyridyl, qunizaolinyl, purinyl, pyrrolo[2,3]pyrimidyl, pyrazolo[3,4]pyrimidyl or benzo(b)thienyl each of which is optionally substituted. Heteroaryl groups may be substituted or unsubstituted.

A "heteroarylene" refers to an heteroaryl group that has at least two points of attachment to at least two moieties. Heteroarylene groups may be substituted or unsubstituted.

A "heteroarylalkyl group" refers to an heteroaryl group that is attached to another moiety via an alkylene linker. Heteroarylalkyl groups may be substituted or unsubstituted. When a heteroarylalkylene is substituted, the substituents may be on either the aromatic ring or the alkylene portion of the heteroarylalkyl. Heteroarylalkyl groups may be substituted or unsubstituted.

A "heteroarylalkylene" refers to an heteroarylalkyl group that has at least two points of attachment to at least two moieties. Heteroarylalkylene groups may be substituted or unsubstituted.

A "heterocycloalkyl" refers to a non-aromatic ring which contains one or more, for example, one to four, oxygen, nitrogen or sulfur (e.g., morpholine, piperidine, piperazine, pyrrolidine, and thiomorpholine). Heterocycloalkyl groups may be substituted or unsubstituted.

A "heterocycloalkylene" refers to a heterocycloalkyl that has at least two points of attachment to at least two moieties. Heterocycloalkylene groups may be substituted or unsubstituted.

Suitable substituents for an alkyl, an alkylene, an alkenyl, an alkenylene, an alkynyl, an alkynylene, a heteroalkyl, a heteroalkylene, a heterocycloalkyl, a heterocycloalkylene group, an aryl, an arylene group, an arylalkyl, an arylalkylene, a heteroaryl, a heteroarylene, a heteroarylalkyl, and a heteroarylkylene groups include any substituent that is stable under the reaction conditions used in the method of the invention. Examples of substituents include an aryl (e.g., phenyl), an arylalkyl (e.g., benzyl), nitro, cyano, halo (e.g., fluorine, chlorine and bromine), alkyl (e.g., methyl, ethyl, isopropyl, cyclohexyl, etc.) haloalkyl (e.g., trifluoromethyl), alkoxy (e.g., methoxy, ethoxy, etc.), hydroxy, —$NR_3R_4$, —$NR_3C(O)R_5$, —$C(O)NR_3R_4$, —$C(O)R_3$, —$C(O)OR_3$, —$OC(O)R_5$, wherein $R_3$ and $R_4$ for each occurrence are, independently, —H, an alkyl, an aryl, or an arylalkyl; and $R_5$ for each occurrence is, independently, an alkyl, an aryl, or an arylalkyl.

Alkyl, alkylene, heterocycloalkylene groups, and any saturated portion of alkenyl, alkenylene, alkynyl, alkynylene groups, may also be substituted with =O and =S.

When a heteroalkylene, a heterocycloalkyl, a heterocycloalkylene, a heteroaryl, or a heteroarylene group contain a nitrogen atom, it may be substituted or unsubstituted. When a nitrogen atom in the aromatic ring of a heteroaryl or a heteroarylene group has a substituent, the nitrogen may be a quaternary nitrogen.

The term "nucleic acids," or "oligonucleotides," as used herein, refers to a polymer of nucleotides. Typically, a nucleic acid comprises at least three nucleotides. The polymer may include natural nucleosides (i.e., adenosine, thymidine, guanosine, cytidine, uridine, deoxyadenosine, deoxythymidine, deoxyguanosine, and deoxycytidine) or modified nucleosides. Examples of modified nucleotides include base modified nucleoside (e.g., aracytidine, inosine, isoguanosine, nebularine, pseudouridine, 2,6-diaminopurine, 2-aminopurine, 2-thiothymidine, 3-deaza-5-azacytidine, 2'-deoxyuridine, 3-nitorpyrrole, 4-methylindole, 4-thiouridine, 4-thiothymidine, 2-aminoadenosine, 2-thiothymidine, 2-thiouridine, 5-bromocytidine, 5-iodouridine, inosine, 6-azauridine, 6-chloropurine, 7-deazaadenosine, 7-deazaguanosine, 8-azaadenosine, 8-azidoadenosine, benzimidazole, M1-methyladenosine, pyrrolo-pyrimidine, 2-amino-6-chloropurine, 3-methyl adenosine, 5-propynylcytidine, 5-propynyluridine, 5-bromouridine, 5-fluorouridine, 5-methylcytidine, 7-deazaadenosine, 7-deazaguanosine, 8-oxoadenosine, 8-oxoguanosine, O(6)-methylguanine, and 2-thiocytidine), chemically or biologically modified bases (e.g., methylated bases), modified sugars (e.g., 2'-fluororibose, 2'-aminoribose, 2'-azidoribose, 2'-O-methylribose, L-enantiomeric nucleosides arabinose, and hexose), modified phosphate groups (e.g., phosphorothioates and 5'-N-phosphoramidite linkages), and combinations thereof. Natural and modified nucleotide monomers for the chemical synthesis of nucleic acids are commercially available.

The term "peptide nucleic acid (PNA)," as used herein, refers to a polymer that has a peptide backbone in which a natural or non-natural nucleic acid base is attached to each amino acid residue. Peptide nucleic acids are described in Hanvey, et al., Science (1992), 258:1481-1485, the entire teachings of which are incorporated by reference. A PNA can bind specifically to a nucleic acid or another PNA that has a complementary sequence of at least three consecutive bases, preferably six consecutive bases, to the sequence of the PNA.

The term "attractive force," as used herein, is a force that draws two or more molecules together. Examples of attractive forces include attraction of a molecule having a net positive charge to a molecule having a net negative charge, dipole-dipole attraction, and magnetic attraction.

Unless specified as a covalent bond, the term "bind" or "bound" includes both covalent and non-covalent associations, such as hydrogen bonds, ionic bonds, covalent bonds, and van der Waals bonds.

The term "recognition component," as used herein, is a component of a molecule that can bind specifically to another molecule.

"Specific binding," as used herein, is when a recognition component of a molecule binds one or more other molecule or complex, with specificity sufficient to differentiate between the molecule or complex and other components or contaminants of a sample. Molecules that include recognition components and their targets are conventional and are not described here in detail. Techniques for preparing and utilizing such systems are well known in the art and are exemplified in the publication of Tijssen, P., "Laboratory Techniques in Biochemistry and Molecular Biology Practice and Theories of Enzyme Immunoassays" (1988), eds. Burdon and Knippenberg, New York: Elsevier, the entire teachings of which are incorporated herein. Preferred recognition components and their targets include nucleic acid/complementary nucleic acid, antigen/antibody, antigen/antibody fragment, avidin/biotin, streptavidin/biotin, protein $A/I_g$, lectin/carbohydrate and aptamer/target.

As used herein, "aptamer" refers to a non-naturally occurring nucleic acid that binds selectively to a target. The nucleic acid that forms the aptamer may be composed of naturally occurring nucleosides, modified nucleosides, naturally occurring nucleosides with hydrocarbon linkers (e.g., an alkylene) or a polyether linker (e.g., a PEG linker) inserted between one or more nucleosides, modified nucleosides with hydrocarbon or PEG linkers inserted between one or more nucleosides, or a combination of thereof. In one embodiment, nucleotides or modified nucleotides of the nucleic acid ligand can be replaced with a hydrocarbon linker or a polyether linker provided that the binding affinity and selectivity of the nucleic acid ligand is not substantially reduced by the substitution (e.g., the dissociation constant of the aptamer for the target should not be greater than about $1 \times 10^{-6}$ M). The target molecule of a aptamer is a three dimensional chemical structure that binds to the aptamer. However, the aptamer is not simply a linear complementary sequence of a nucleic acid target but may include regions that bind via complementary Watson-Crick base pairing interrupted by other structures such as hairpin loops). Targets of aptamers include peptide, polypeptide, carbohydrate and nucleic acid molecules.

DETAILED DESCRIPTION

The method of the invention involves stamping of molecular patterns and/or devices based on the reversible self-assembly of molecules, particularly organic molecules. This method is suitable for the stamping of almost any nanofabricated device, inorganic and/or organic, and can be used to transferring a large amount of information from one substrate to another. The working principle of this technique is completely different from any present nanofabrication technique.

In the method of the invention, a master, that includes a substrate having a first set of molecules bound to at least one surface in a pattern, is used to induce the assembly of a second set of molecules via reversible supra-molecular chemistry (e.g., hydrogen bonds, ionic bonds, covalent bonds, van der Waals bonds, or a combination thereof); then, with the use of substantially irreversible surface chemistry, the second set of molecules are attached to a surface of a substrate and subsequently the reversible bonds between the first set of molecules and the second set of molecules are broken. The term "substantially irreversible," as used herein, means that the second set of molecules are attached to the surface of the substrate by bonds that are stable to conditions that will break the bonds between the first and the second set of molecules. The method of the invention uses supra-molecular bonds as a means for shape-transfer, this avoids the need for mechanical contacts, and thus constitutes a major departure from nano-imprinting developed by Chou and co-workers. This method is tailor-made to transfer organic patterns reliably. The use of organic molecules allows a great number of variations and enables the transfer of multiple surface features at the same time.

Figure 2:
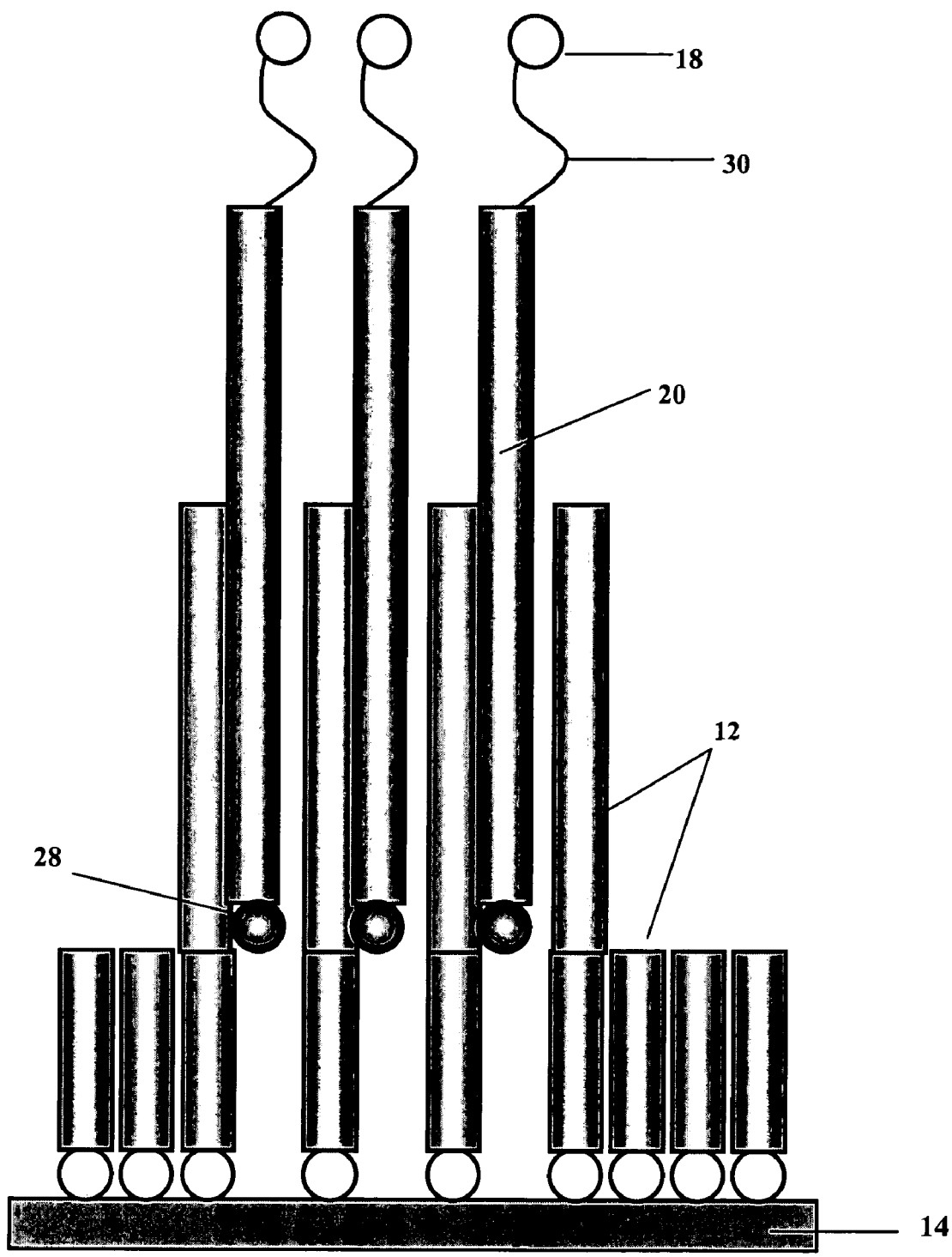
FIG. 2 is a schematic representation of a first set of molecules bound to a second set of molecules.

Referring to FIG. 1, in one embodiment, the method of forming a complement image of a master involves providing a master 10 that comprises a first set of molecules 12 bound to a first substrate 14 to form a pattern. A second set of molecules 16 is assembled on the first set of molecules via bond formation. The second set of molecules comprises a reactive functional group 18 and a recognition component 20 (not shown in FIG. 1) that binds to the first set of molecules 12 (see FIG. 2 which provides a blowup of the second set of molecules bound to the first set of molecules). The reactive functional group 18 of the second set of molecules 16 is then contacted with a surface of a second substrate 22. The reactive functional group reacts with the surface of the second substrate to form a bond between the second set of molecules and the second substrate. In one embodiment, the remaining exposed surface of the second substrate may be further contacted with another group of molecules 24 that each have a reactive functional groups, such as an alkane having a thiol substituent, that can bind to the surface in order to cover the exposed surface of the second substrate. The bonds between the first set of molecules and the second set of molecules are then broken, and the second set of molecules bound to the second substrate forms a complement image of the master 26. Once the master has been separated from the complement image by breaking the bonds between the first and the second set of molecules, the master can be reused one or more times to form additional complement images. In one embodiment, a lateral dimension of at least one feature of the complement image is less than 200 nm.

In one embodiment, the second set of molecules may also include one or more of the following components: an exposed functionality 28; a covalent bond or a first spacer 30 that links the reactive functional group to the recognition component; and a covalent bond or a second spacer that links the exposed functionality to the recognition component.

The second set of molecules may include two or more different molecules. For example, two or more molecules of the second set of molecules may have different recognition components, such as different nucleic acid sequences; or two or more molecules of the second set of molecules may have both different recognition components and different exposed functionalities. Typically, one or more molecules from the first set of molecules determines where each of the molecules from the second set of molecules binds.

In one embodiment, the two or more different molecules of the second set of molecules form a pattern on the second substrate that has a height profile that comprises two or more depths. For example, two or more molecules of the second set of molecules may have either a first spacer, a second spacer or both a first and a second spacer that have different lengths. The difference in the length of the spacers can cause the molecular image transferred to the second substrate to have two or more different depths.

In one embodiment, the second set of molecules is assembled on the first set of molecules by contacting the master with a solution comprising the second set of molecules. In one method of transferring the pattern on a master to a second substrate, the master is held in contact with the second substrate by capillary action of the solution containing the second set of molecules. A small mechanical force may also be applied to hold the two substrates together. The solution containing the second set of molecules is then slowly evaporated causing the master and the second substrate to come closer together and facilitating binding of the second set of molecules to the second substrate.

The bonds formed between the first set of molecules and the second set of molecules may be hydrogen bonds, ionic bonds, covalent bonds, van der Waals bonds, or a combination thereof. Preferably, the bonds formed between the first set of molecules and the second set of molecules are hydrogen bonds. In one embodiment, the bonds between the first set of molecules and the second set of molecules are broken by applying heat. In another embodiment, the bonds between the first set of molecules and the second set of molecules are broken by contacting the bonds with a solution having a high ionic strength. In yet another embodiment, the bonds between the first set of molecules and the second set of molecules are broken by contacting the bonds with a solution having a high ionic strength and applying heat. Alternatively, the bonds between the first set of molecules and the second set of molecules are broken by contacting them with a solution containing an enzyme that breaks the bonds. Typically, the bonds between the first set of molecules and the second set of molecules can be broken without breaking most of the bonds between the second set of molecules and the second substrate.

The reactive functional group on the second set of molecules is typically a group that can bind to the surface of the second substrate. For example, when the reactive functional group on the second set of molecules is a thiol group or a protected thiol group, the surface of the second substrate may be gold, silver, copper, cadmium, zinc, palladium, platinum, mercury, lead, iron, chromium, manganese, tungsten, or any alloys thereof. In another example, the reactive functional group on the second set of molecules is a silane or a chlorosilane, and the surface of the second substrate is doped or undoped silicon. In another example, the reactive functional group on the second set of molecules is a carboxylic acid, and the surface of the second substrate is an oxide, such as silica, alumina, quartz, or glass. In another example, the reactive functional group on the second set of molecules is a nitrile or an isonitrile, and the surface of the second substrate is platinum, palladium or any alloy thereof. In another example, the reactive functional group on the second set of molecules is a hydroxamic acid, and the surface of the second substrate is copper.

In one embodiment, at least some of the molecules of the first set of molecules include a recognition component that binds to the one or more molecules of the second set of molecules. For example, each of the molecules of the first set of molecules may include a recognition component that is a nucleic acid sequence. In one embodiment, each of the first set of molecules is a nucleic acid sequence and the recognition component of the second set of molecules is a nucleic acid sequence. Preferably, the nucleic acid recognition component of each of the second set of molecules is complementary to at least a portion of a nucleic acid sequence of at least one of the molecules from the first set of molecules. For example, three or more consecutive nucleic acid bases, preferably six or more nucleic acid bases, of a molecule from the second set of molecules is complementary with three or more consecutive nucleic acid bases, preferably six or more nucleic acid bases, of a molecule from the first set of molecules. When the second set of molecules is assembled on the first set of molecules, the second set of molecules will hybridize with molecules from the first set of molecules that have a complementary sequence, or a portion thereof, to the nucleic acid recognition component of the second set of molecules. In this embodiment, typically, the first set of molecules bound to the master are contacted with a solution of the second set of molecules under conditions that promote hybridization. Conditions that promote hybridization are known to those skilled in the art. A general description of hybridization conditions are discussed in Ausebel, F. M., et al., Current Protocols in Molecular Biology, Greene Publishing Assoc. and Wiley-Interscience, 1989, the teachings of which are incorporated herein by reference. Factors such as sequence length, base composition, percent mismatch between the hybridizing sequences, temperature and ionic strength influence the stability of nucleic acid hybrids.

In one embodiment, the first set of molecules includes two or more different molecules that have recognition components that are different nucleic acid sequences. In this embodiment, the second set of molecules includes molecules that have a nucleic acid sequence, or a portion thereof, that is complementary to at least one of the molecules of the first set of molecules. In one embodiment, hydrogen bonds between hybridized molecules from the first set of molecules and the second set of molecules are broken by contacting the hydrogen bonds with an enzyme. For example, an enzyme from the helicase family of enzymes may be use to break the bonds between hybridized nucleic acid molecules. Various helicases have been reported to dehybridize double stranded oligonucleotides. For example, E. coli Rep, E. coli DnaB, E. coli UvrD (also known as Helicase II), E. coli RecBCD, E. coli RecQ, bacteriophage T7 DNA helicase, human RECQL series; WRN(RECQ2), BLM(RECQL3), RECQL4, RECQL5, S. Pombe rqh1, C. elegance T04A11.6 (typically, the helicase name is derived from the organism from which enzymes comes). Helicases can be divided into two types: 1) helicase that move along the nucleic acid strand in the 3' direction, and 2) helicases that more along the nucleic acid strand in the 5' direction one. Typically, the particular type of helicase used to break the hydrogen bonds between the hybrided nucleic acids are selected by considering structural hindrance of the particular hybridized nucleic acids. Cofactors which stabilize single stranded DNA, such as single stranded DNA binding protein (SSB), could be added.

Another method of breaking the bonds between two hybridized nucleic acids would be to use a restriction endonuclease, which recognizes specific base sequence and cleaves both strands at a specific location in the nucleic acid sequence. Examples of restriction endonucleases include BamHI, EcoRI, and BstXI. Other methods of dehybridazition of nucleic acids using enzymes can be found in Lubert Stryer, Biochemistry, 4th Edition; Benjamin Lewin, Gene VII; Kristen Moore Picha and Smita S. Patel, "Bacteriophage T7 DNA Helicase Binds dTTP, Forms Hexamers, and Binds DNA in the Absence of Mg2+," *J. Biol. Chem.* (1998), Vol. 273, Issue 42, 27315-27319; Sheng Cui, Raffaella Klima, Alex Ochem, Daniele Arosio, Arturo Falaschi, and Alessandro Vindigni, "Characterization of the DNA-unwinding Activity of Human RECQ1, a Helicase Specifically Stimulated by Human Replication Protein A," *J. Biol. Chem.* (2003), Vol. 278, Issue 3, 1424-1432; Umezu, K., and Nakayama, H. (1993), *J. Mol. Biol,*. 230:1145-1150; Nakayama, K., Irino, N., and Nakayama, H., *Mol. Gen. Genet*. (1985), 200:266-271; Kusano, K., Berres, M. E., and Engels, W. R., *Genetics* (1999), 15:1027-1039; Ozsoy, A. Z., Sekelsky, J. J., and Matson, S. W., *Nucleic Acids Res.* (2001), 29:2986-299, the entire teachings of these references is incorporated herein by reference.

Alternatively, the bonds between the first set of molecules and the second set of molecules are broken by applying heat, by contacting the bonds with a solution having a high ionic strength, or by contacting the bonds with a solution having a high ionic strength and applying heat.

Typically, the nucleic acid sequence of the first and second sets of molecules are DNA, RNA, modified nucleic acid sequences or any combinations thereof.

In an alternative embodiment, a component of each of the first set of molecules is a peptide nucleic acid (PNA) sequence and the recognition component of the second set of molecules is a PNA sequence. Alternatively, a component of each of the molecules from the first set of molecules is a peptide nucleic acid (PNA) sequence and the recognition component of the second set of molecules is a nucleic acid sequence, or vice versa. PNA molecules hybridize to other PNA molecules and to nucleic acid sequences in a manner similar to that of nucleic acid hybridization to other nucleic acid. Thus, at least one or more molecule from the second set of molecules must have at least three consecutive bases, preferably six consecutive bases, that are complementary to three consecutive bases, preferably six consecutive bases, of a molecule from the first set of molecules.

When a set of molecules bind to the surface of a substrate, the molecules will fold or stack against one another such that a portion of the molecule will be exposed on the surface of the substrate. The exposed functionality may be hydrophobic, hydrophilic, or an amphipathic functionality. In addition, the exposed functionality may be a functionality that selectively binds various biological or other chemical species such as proteins, antibodies, antigens, sugars and other carbohydrates, and the like. Other examples of exposed functionalities include —OH, —CONH—, —CONHCO—, —$NH_2$, —NH—, —COOH, —COOR, —CSNH—, —$NO_2^-$, —$SO_2$, —SH, —RCOR—, —RCSR—, —RSR, —ROR—, —$PO_4^{-3}$, —$OSO_3^{-2}$, —$SO_3^-$, —$COO^-$, —$SOO^-$, —RSOR—, —$CONR_2$, —$(OCH_2CH_2)_n OH$ (where n=1-20, preferably 1-8), —$CH_3$, —$PO_3H^-$, -2-imidazole, —N$(CH_3)_2$, —$N(R)_2$, —$PO_3H_2$, —CN, —$(CF_2)_n CF_3$ (where n=1-20, preferably 1-8), and an olefin, wherein, R is hydrogen, a hydrocarbon, a halogenated hydrocarbon, a protein, an enzyme, a carbohydrates, a lectin, a hormone, a receptor, an antigen, an antibody, or a hapten.

The exposed functionality may include a protecting group which may be removed to effect further modification of the complement image or the reproduction of the master. For example, a photoremovable protecting group may be used. A wide variety of positive light-reactive groups are known in the art, for example, nitroaromatic compounds such as o-nitrobenzyl derivatives or benzylsulfonyl. Photoremovable protective groups are described in, for example, U.S. Pat. No. 5,143,854, the entire teachings of which are incorporated herein by reference, as well as an article by Patchornik, *JACS*, 92:6333 (1970) and Amit et al, *JOC*, 39:192, (1974), both of which are incorporated herein by reference.

In one embodiment, the complement image can be further modified by binding the exposed functional group of at least one of the second set of molecules to a metal or a metal ion. For example, when the exposed functional group is —SH, the metal or metal ion can be $Au^\circ$, $Ag^\circ$, or $Ag^+$. Alternatively, when the exposed functional group is —COOH, the metal or metal ion can be $Ag^\circ$ or $Ag^+$.

The second set of molecules may have a first spacer, a second spacer, or a first and the second spacer. The spacers may be, independently, selected from the group consisting of an alkylene, a heteroalkylene, a heterocycloalkylene, an alkenylene, an alkynylene, an arylene, a heteroarylene, arylalkylene, and a heteroarylalkylene. The alkylene, heteroalkylene, heterocycloalkylene, alkenylene, alkynylene, arylene, heteroarylene, arylalkylene, and heteroarylalkylene spacers may be substituted or unsubstituted. In one embodiment, either the first or the second spacers, or both the first and the second spacers are substituted with one or more halogen and/or hydroxy.

The master may be prepared by any method known to those skilled in the art (see Xia, et al., *Chem. Rev.* (1999), 99:1823-1848, the entire teachings of which are incorporated by reference). Preferably, the method of forming the master is a nanopatterning method. In one embodiment, the master is prepared by forming a pattern of one or more metal, metal oxide, or combinations thereof on a surface of a substrate using electron beam lithography. The surface of the substrate is then contacted with a first set of molecules. In this embodiment, each of the first set of molecules has a reactive functional group that forms a bond between the metal or metal oxide and the molecules of the first set of molecules, so that the first set of molecules binds to the substrate forming a master having a first set of molecules bound to the substrate to form a pattern. For example, when the reactive functional group of at least one molecule from the first set of molecules is a thiol group or a protected thiol group, at least a portion of the patterned formed may be a metal selected from the group consisting of gold, silver, copper, cadmium, zinc, palladium, platinum, mercury, lead, iron, chromium, manganese, tungsten, and any alloys thereof. In another example, when the reactive functional group of at least one molecule from the first set of molecules a silane or a chlorosilane, at least a portion of the patterned formed is a metal selected from the group consisting of doped and undoped silicon. In another example, when the reactive functional group of at least one molecule from the first set of molecules is a carboxylic acid, at least a portion of the patterned formed is an oxide selected from the group consisting of silica, alumina, quartz, and glass. In another example, when the reactive functional group of at least one molecule from the first set of molecules is a nitrile or an isonitrile, at least a portion of the patterned formed is a metal selected from the group consisting of platinum, palladium and alloys thereof. In another example, when the reactive functional group of at least one molecule from the first set of molecules is a hydroxamic acid, at least a portion of the patterned formed is copper.

Alternatively, the master can be prepared using dip pen nanolithography. Methods of preparing molecularly patterned substrates using dip pen nanolithography are described in Schwartz, *Langmuir* (2002), 18:4041-4046 and in Piner, et al., *Science* (1999), 283:661-663, the entire teachings of both references are incorporated herein by reference.

Alternatively, the master can be prepared using replacement lithography, nanoshading or nanografting. These methods are described in Sun, et al., *JACS* (2002), 124(11):2414-2415; Amro, et al., *Langmuir* (2000), 16:3006-3009; Liu, et al., *Nano Letters* (2002), 2(8):863-867; and Liu, et al., *Acc. Chem. Res.* (2000), 33:457-466; the entire teachings of these references are incorporated herein by reference.

Another embodiment is a lithographic method in which at least one portion of the second substrate surface is free of the second set of molecules. In this embodiment, the exposed surface of the second substrate is contacted with a reactant selected to be chemically inert to the second set of molecules and to degrade at least the surface layer of the second substrate, thereby degrading the portion of the surface of the second substrate that is free of the second set of molecules. Typically, the reactant is a reactive ion etching compound. The second set of molecules is then removed to uncover a portion of the surface of the second substrate.

In another embodiment, at least one portion of the second substrate surface is free of the second set of molecules, and a material is deposited on the portion of the second substrate surface that is free of the second set of molecules. Examples of deposited material include semiconductors, dielectrics, metals, metal oxides, metal nitrides, metal carbides, and combinations thereof. The second set of molecules is then removed to uncover a portion of the surface of the second substrate.

In one aspect of the invention, the method of forming a complement image of a master involves assembling a second set of molecules via attractive forces on the first set of molecules. Examples of attractive forces include attraction of a molecule having a net positive charge to a molecule having a net negative charge, dipole-dipole attraction, and magnetic attraction. In one preferred embodiment, the attractive force is a magnetic force. In one example, when the attractive force is a magnetic force, one or more molecules from the first set of molecules and from the second set of molecules include an iron or iron oxide component. In this embodiment, the attractive forces between the first set of molecules and the second set of molecules can be broken by applying a magnetic field.

In another aspect of the invention, the method involves forming a reproduction of a master, or a portion thereof. The master used in this embodiment of the method of the invention comprises a first set of molecules bound to a first substrate to form a pattern. A second set of molecules is assembled on the first set of molecules via bond formation. The second set of molecules comprises a reactive functional group and a recognition component that binds to the first set of molecules. The reactive functional group of the second set of molecules is then contacted with a surface of a second substrate. The reactive functional group reacts with the surface of the second substrate to form a bond between the second set of molecules and the second substrate. The bonds between the first set of molecules and the second set of molecules are then broken, and the second set of molecules bound to the second substrate forms a complement image of the master. A third set of molecules is then assembled via bond formation on the second set of molecules of the complement image. Each molecule in the third set of molecules comprises a reactive functional group, and a recognition component that binds to the second set of molecules. The reactive functional group of the third set of molecules is then contacted with a surface of a third substrate. The surface of the third substrate reacts with the reactive functional group of the third set of molecules to form a bond between the third set of molecules and the third substrate. The bonds between the second set of molecules and the third set of molecules are then broken, and the third set of molecules bound to the third substrate form a reproduction of the pattern, or portion thereof, of the master. Once the complement image has been separated form the reproduction, the complement image can be reused one or more times to form additional reproductions. In one embodiment, a lateral dimension of at least one feature of the reproduction is less than 200 nm.

The method of forming a reproduction is the same as that used to form a complement image except that the complement image of the master is used as a template (or "master") to transfer the pattern to the third substrates. Thus, the embodiments and examples disclosed above for the second set of molecules and the second substrate apply as well to the third set of molecules and the third substrate, respectively. In addition, examples of conditions for assembling the second set of molecules on the first set of molecules and for breaking the bonds between the first and the second set of molecules can apply equally as well to conditions for assembling the third set of molecules on the second set of molecules and for breaking the bonds between the third and the second set of molecules.

In another aspect, the invention relates to a composition comprising a master having a pattern of a first set of molecules bound to a first substrate; and a complement image comprising a pattern of a second set of molecules bound to a second substrate via a reactive functional group on each molecule of the second set of molecules. In this aspect of the invention, each molecule in the second set of molecules has a recognition component that binds to at least a portion of a molecule from the first set of molecule.

In another aspect, the invention relates to a composition, comprising a first pattern of a first set of molecules bound to a first substrate; and a second pattern of a second set of molecules bound to a second substrate via a reactive functional group on each molecule of the second set of molecules. In this aspect of the invention, each molecule of the second set of molecules comprises a recognition component that binds to at least one molecule in the first set of molecules, and the second pattern is a complement image of the first pattern. Alternatively, the invention relates to a composition, comprising a first pattern of a first set of molecules bound to a first substrate; and a third pattern of a third set of molecules bound to a third substrate via a reactive functional group on each molecule of the third set of molecules. In this aspect of the invention, each molecule of the third set of molecules comprises a recognition component that binds to at least one molecule in the second set of molecules, and the third pattern is a reproduction of the first pattern, or a portion thereof.

In another aspect, the invention relates to a composition, comprising a first pattern of a first set of molecules bound to a first substrate; and a second substrate, wherein the second substrate comprises a degraded portion and an undegraded portion, and the undegraded portion is a complement image of the first pattern.

In another aspect, the invention relates to a composition, comprising a first pattern of a first set of molecules bound to a first substrate; and a second substrate having a patterned layer of a material deposited thereon, wherein the patterned layer of deposited material on the second substrate is a complement image of the first pattern.

In another aspect, the invention relates to a kit for printing a molecular pattern on a substrate. The kit comprise a master comprising a pattern of a first set of molecules bound to a substrate; and a second set of molecules. The second set of molecules comprises a reactive functional group; and a recognition component that binds to the first set of molecules.

In another aspect, the invention relates to a molecular printer for generating a complement image of a master, wherein the master has a first set of molecules bound to a first substrate. The molecular printer comprises comprising a device for delivering a solution of a second set of molecules to a surface of the master, and a device for contacting the second set of molecules with a second substrate. In this embodiment, the second set of molecules comprises a reactive functional group; and a recognition component that binds to the first set of molecules.

Generally, the apparatus comprises one or more reservoirs that contain the second set of molecules, one or more vessels or components for holding a master in position for delivery of the solution containing the second set of molecules. In addition, the apparatus may include a computer controlled means for transferring in a predetermined manner the solution of the second set of molecules from the reservoirs to the surface a master. A clamp that secures the master to the second substrate may also be included in the apparatus of the invention. The temperature of the solution of the second set of molecules and the vessel containing the master may also be controlled. The apparatus may also include a reservoir containing a solution for breaking the bonds between the first and the second molecules, such as a solution having a high ionic strength or a solution containing an enzyme that will break the bonds, and a means for delivering the solution. In addition, after the second substrate has been bound to the second set of molecules, a heating element may be used to heat a solution in contact with the bound first and second sets of molecules to break the bonds. The computer controlled means for transferring solutions and controlling temperature can be implemented by a variety of general purpose laboratory robots, such as that disclosed by Harrison et al, *Biotechniques,* 14: 88-97 (1993); Fujita et al, *Biotechniques,* 9: 584-591 (1990); Wada et al, *Rev. Sci. Instrum.,* 54: 1569-1572 (1983), the entire teachings of these references are incorporated herein by reference. Such laboratory robots are also available commercially, e.g. Applied Biosystems model 800 Catalyst (Foster City, Calif.). In one embodiment, the apparatus also includes a device for separating the second substrate from the master after the bonds between the first set of molecules and the second set of molecules have been broken.

These and other aspects of the present invention will be further appreciated upon consideration of the following Examples, which are intended to illustrate certain particular embodiments of the invention but are not intended to limit its scope, as defined by the Claims.

EXAMPLES

Example 1

Preparation of a Complement Image of a DNA Monolayer

A. Preparation of DNA Solutions

All glassware was cleaned with a solution of 75% $H_2SO_4$ and 25% $H_2O_2$ before use. All water used was ultrapure water (18MΩ/cm).

The primary DNA, 5'-/5-ThiolMC6-D/ACG CAA CTT CGG GCT CTT-3' (SEQ ID NO: 1), were purchased from Integrated DNA Technologies, Inc. (IDT), Coraville, IA. All DNA strands were used as received from the manufacturer. The primary DNA was dissolved in water at the concentration of 1 µg/mL and divided into smaller aliquots of 50 µL. and stored at −20° C. When a portion of this solution was used, an aliquot was reduced by placing it in a 40 mM buffer solution (0.17 M sodium phosphate, pH 8) having dithiothreitol (DTT) for 16 hr. The oligonucleotides were separated from the by-products of the DTT reaction using size exclusion chromatography (NAP 10 column from Pharmacia Biotech) following the manufactures instructions. 10 mM sodium phosphate buffer (pH 6.8) was used to equilibrate the column and to elute the oligonucleotides. The concentration of the resulting DNA solution was calculated from the absorbance of the solution at 260 mm. In the case of primary DNA (i.e., the DNA used to form the master), 1M potassium phosphate buffer solution (pH 3.8) was added to the DNA solution to increase the ionic strength of the solution. The final concentration of DNA was 4-5 µM.

In the case of secondary DNA solution (i.e., DNA used to form the complement image), 1M NaCl in TE buffer (10 mM Tris buffer pH 7.2 and 1 mM EDTA) was added to Increase the ionic strength of the solution. The secondary DNA used was purchased from Integrated DNA Technologies, Inc. (IDT), Coraville, IA and had the following structure 5'-/5ThiolMC6-D/AAG AGC CCG AAG TTG CGT-3' (SEQ ID NO: 2).

B. Preparation of a Master having a DNA Monolayer

Clean and atomically flat gold on mica was used as a substrate. This substrate was placed in the primary DNA solution prepared above for 5 days to allow the DNA to bind to the surface of the substrate. The substrate was rinsed with 1M potassium phosphate buffer 2 times and with water 5 times. The substrate was exposed to 1 mM spacer thiol, 6-mercapto-1-hexanol, aqueous solution for 2 hr to minimize nonspecific adsorption of single-stranded DNA, then rinsed with water 5 times.

C. Preparation of Complement Image

The master prepared in step B was dipped into the secondary DNA solution for 2 hours to allow the complementary DNA to hybridize to the DNA bound to the master. The substrate was rinsed with 1M NaCl in TE buffer 2 times and with water 5 times.

Figure 3:
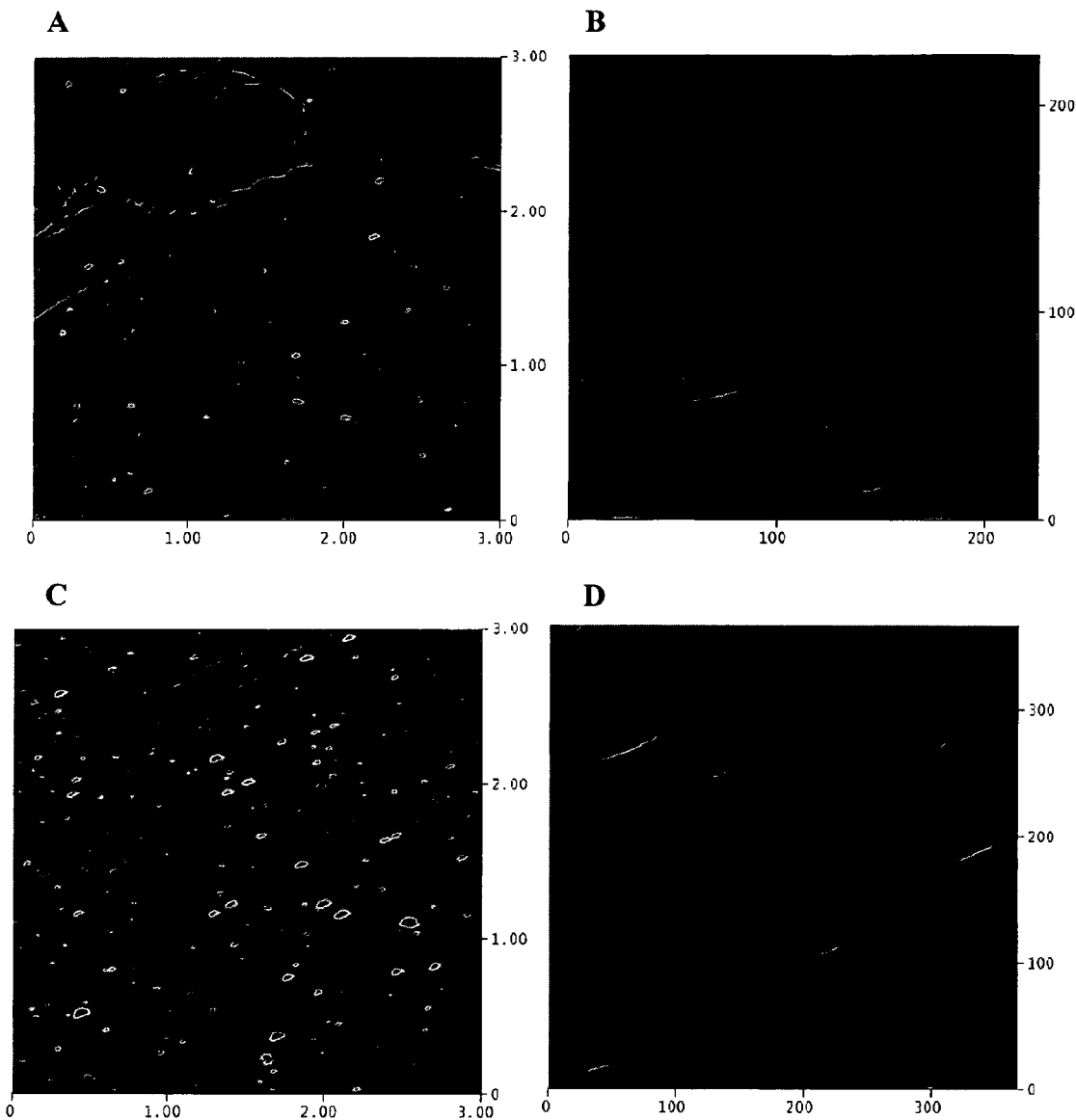
FIGS. 3A and 3B are AFM images of a master having a monolayer of nucleic acid molecules bound to the surface of a substrate.
FIG. 3C is an AFM image of a complement image of the master shown in FIG. 3A.
FIG. 3D is an AFM image of a complement image of the master shown in FIG. 3B.

A second clean gold on mica substrate was placed in contact with the master so that the two gold surfaces were facing each other and had a small amount of water in between them. A small mechanical force was applied to push the two substrates together. As water between two substrates was evaporating, the spacing between the surfaces decreased due to increasing capillary attraction forces. Consequently, thiol groups of secondary DNA approached the second substrate and bound to it. After about 5 hr, the substrates were dipped into 1M NaCl in TE buffer solution (70° C.) for 20 min. The substrates (i.e., the master and the complement image) spontaneously separated and were rinsed with 1M NaCl in TE buffer 2 times and with water 5 times, then air-dried. Both the master (see FIGS. 3A and 3B) and the complement image (see FIGS. 3C and 3D) were imaged using AFM tapping mode.

D. Results

The coverage of the first substrate surface with DNA was complete. The thorough coverage made AFM imaging difficult due to strong interaction between monolayer and a tip. The layer transferred to the second substrate also had complete coverage.

Example 2

Pattern Transfer of Gold Grid

Figure 4:
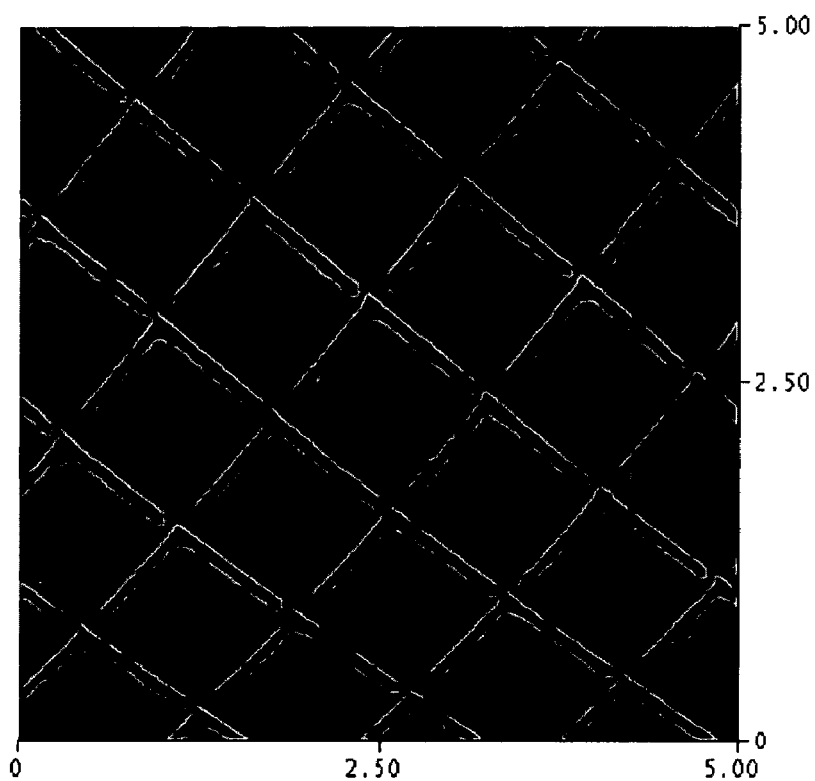
FIG. 4A is an AFM image of a master having nucleic acids bound to a substrate in a grid pattern.
FIG. 4B is an AFM image of a complement image of the master shown in FIG. 4A.
Figure 4:
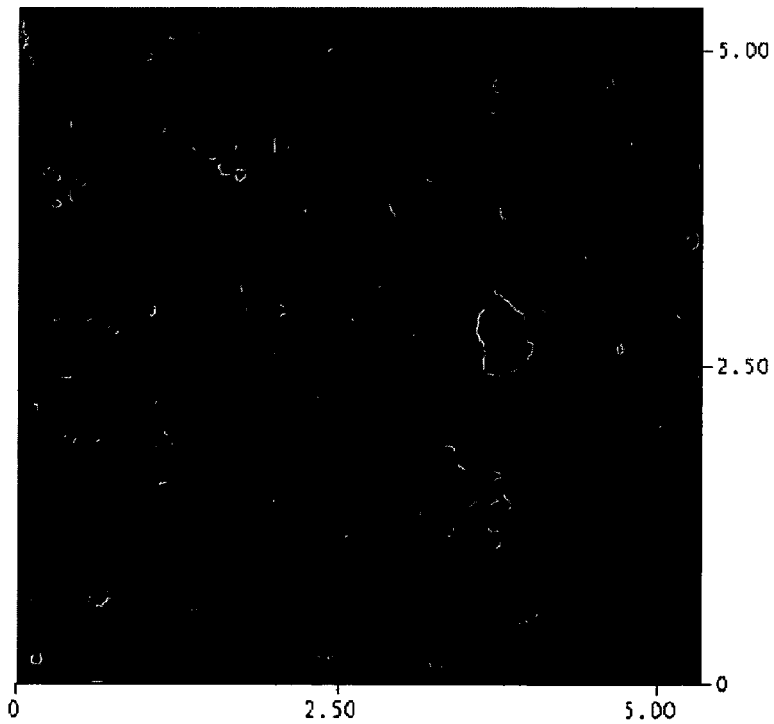

An AFM calibration gold grid was dipped in 4 µM solution of the primary DNA molecules described in Example 1 for 5 days to generate a patterned master. The master was exposed to 1 mM 6-mercapto-1-hexanol aqueous solution for 2 hr to minimize nonspecific adsorption of single-stranded DNA, then rinsed with water 5 times and air-dried. The master was then exposed to a 6 µM solution of the secondary DNA described in Example 1 for 2 hours so that hybridization occurred. A second substrate of gold on mica was placed on the master so that the two gold surfaces were facing each other and had a small amount of water in between them. A small mechanical force was applied to force the two substrates together. After about 5 hr, the substrates were dipped into 1M NaCl in TE buffer solution (70° C.) for 20 min. The two substrates (i.e., master and the complement image) spontaneously separated and were rinsed with 1M NaCl in TE buffer 2 times and with water 5 times, then air-dried. Both the master and the complement image were imaged using AFM tapping mode (see FIGS. 4A and 4B, respectively).

Example 3

Fabrication of a DNA Chip

A master is prepared using Dip Pen Nanolithography, as described in Demer, et al., *Angew. Chem. Int. Ed.* (2001), 40:30713073, the entire teachings of which are incorporated herein by reference. To prepare the master, a surface of a gold on mica substrate is contacted with a 1 mM solution of 1-octadecanethiol (ODT) in ethanol for 5 min. to cover the exposed gold surface with ODT molecules. The substrate is then immersed in a 1 mM solution of 1,16-mercaptohexadecanoic acid (MHA) and the tip of an atomic force microscope is used to displace ODT molecules bound to the surface by contacting the surface with a force of about 0.5 nN making a 100 nm dot. The MHA in solution binds to the exposed gold surface of the dot. The carboxylic acid groups of the MHA are activated with a 10 mg/mL solution of 1-ethyl-3-(3-dimethylaminoproppyl)carbodiimide hydrochloride (EDAC) in 0.1M morpholine/ethanesulfonic acid at pH 4.5, and then rinsed with a solution of 0.1M sodium borate/boric acid buffer, pH 9.5. A 25 µM solution of a DNA modified with a 1-n-hexyl amine group in the borate buffer is placed on the surface of the substrate. The amine groups of the DNA bind to the activated MHA molecules forming a DNA dot having a 100 nm diameter. The procedure of forming an MHA dot and binding a DNA molecule to it is repeated many more times with different amine modified DNA molecules to form a master having a DNA array with feature of about 100 nm.

The master is used to print a complement image array of DNA sequences on a second substrate in which each DNA sequence is complementary to one of the DNA molecules on the master and is located at a position on the second substrate that is a mirror image of its complementary sequence on the master. The complement image array is prepared by modifying a set of DNA molecules that includes all of the DNA molecules that are complementary to the DNA molecules on the master with a hexyl thiol linker. The thiol modified DNA molecules are placed in a phosphate buffer having a pH of 6.8 and 1 M NaCl. The master is immersed in the solution containing the thiol modified DNA molecules for 2 hrs, then master is removed from the solution and rinsed with 1 M NaCl in TE buffer once and with water five times.

A second clean gold on mica substrate is placed in contact with the master so that the two gold surfaces are facing each other and have a small amount of water in between them. A small mechanical force is applied to push the two substrates together. As water between the two substrates evaporates, the spacing between the surfaces decreases due to increasing capillary attraction forces. Consequently, thiol groups of the thiol modified DNA molecules approach the second substrate and bind to it. After about 5 hrs, the substrates are dipped into 1M NaCl in TE buffer solution (70° C.) for 20 min. The substrates spontaneously separate and are rinsed with 1M NaCl in TE buffer 2 times and with water five times, then allowed to air dry. The master can be used to prepare one or more additional complement images.

Example 4

Preparation of a Complement Image of a DNA Array

A DNA chip is purchased and used as a primary master. The DNA chip has a 12×12 square array in which each square is 300 nm×300 nm and has a different DNA sequence attached to a substrate for a total of 144 different DNA sequences. The 300 nm×300 nm squares are spaced 100 nm apart along the x- and y-axis of the surface of the substrate.

The master is used to print a 12×12 complement image array of DNA sequences on a second substrate in which each DNA sequence is complementary to one of the DNA molecules on the master and is located at a position on the second substrate that is a mirror image of its complementary sequence on the master. A set of DNA molecules that includes all of the DNA molecules that are complementary to the DNA molecules on the master (i.e., 144 different complementary DNA sequences) are modified with a hexyl thiol linker. The thiol modified DNA molecules are placed in a phosphate buffer having a pH of 6.8 and 1 M NaCl. The master is immersed in the solution containing the thiol modified DNA molecules for 2 hrs, then master is removed from the solution and rinsed with 1 M NaCl in TE buffer once and with water five times.

A clean gold on mica substrate is placed in contact with the master so that the gold surface of the new substrate is facing the 12×12 array of DNA molecules. A small amount of water is in between the two surfaces. A small mechanical force is applied to push the two substrates together. As water between the two substrates evaporates, the spacing between the surfaces decreases due to increasing capillary attraction forces. Consequently, thiol groups of the thiol modified DNA molecules approach the second substrate and bind to it. After about 5 hrs, the substrates are dipped into 1M NaCl in TE buffer solution (70° C.) for 20 min. The substrates spontaneously separate and are rinsed with 1M NaCl in TE buffer 2 times and with water five times, then allowed to air dry. The complement image has a 12×12 array of DNA molecules that are complementary to the DNA molecules on the master. The master can be used to prepare one or more additional complement image arrays following the same procedure.

In addition, the primary master can be replicated one or more times by following the procedure, as described above, except that the complement image is used in place of the master and a third set of 144 DNA molecules having the same sequences as the DNA molecules on the primary master and modified with a hexyl thiol linker is assembled on the complement image. A third substrate of gold on mica is then brought in contact with the complement image as described above for the primary master and the second substrate. The third set of DNA bound to the third substrate and separated from the complement image is a replica of the primary master.

Other embodiments of the invention will be apparent to those skilled in the art from a consideration of the specification or practice of the invention disclosed herein. It is intended that the specification and examples be considered as exemplary only, with the true scope and spirit of the invention being indicated by the following claims.

SEQUENCE LISTING

```
<160> NUMBER OF SEQ ID NOS: 2

<210> SEQ ID NO 1
<211> LENGTH: 18
<212> TYPE: DNA
<213> ORGANISM: Artificial Sequence
<220> FEATURE:
<223> OTHER INFORMATION: Purchased from Integrated DNA Technologies,
      Inc., Coraville, IA.

<400> SEQUENCE: 1
acgcaacttc gggctctt                                                  18

<210> SEQ ID NO 2
<211> LENGTH: 18
<212> TYPE: DNA
<213> ORGANISM: Artificial Sequence
<220> FEATURE:
<223> OTHER INFORMATION: Purchased from Integrated DNA Technologies,
      Inc., Coraville, IA.

<400> SEQUENCE: 2
aagagcccga agttgcgt                                                  18
``` what is claimed is:

1. A method of forming a complement image of a master, comprising the steps of:
    a) providing a master that comprises a first set of molecules bound to a first substrate to form a pattern;
    b) assembling via attractive forces or bond formation a second set of molecules on the first set of molecules, wherein each molecule in the second set of molecules comprises:
        i) a reactive functional group; and
        ii) a recognition component that is attracted to or binds to one or more of the first set of molecules; and
        iii) optionally a covalent bond or a first spacer that links the reactive functional group to the recognition component;
    c) contacting the reactive functional group of the second set of molecules with a surface of a second substrate, thereby forming a bond between the second set of molecules and said surface of a second substrate such that the second set of molecules are attached to said surface of said second substrate by bonds that are stable to conditions that will break the bonds between the first and the second set of molecules;
    d) breaking the attractive force or bonds between the first set of molecules and the second set of molecules by using a solution having a high ionic strength thereby forming a complement image of the master; and
    e) optionally repeating steps b) through d) one or more times.

2. The method of claim 1, further comprising the steps of:
    a) forming a pattern of one or more metal, metal oxide, or combinations thereof on a surface of a substrate using electron beam lithography;
    b) contacting the surface with the first set of molecules, wherein each molecule of the first set of molecules has a reactive functional group that forms a bond between the metal or metal oxide and the molecules of the first set of molecules, thereby forming a master that comprises a first set of molecules bound to the substrate to form a pattern.

3. The method of claim 1, wherein at least one portion of the second substrate surface is free of the second set of molecules.

4. The method of claim 3, further comprising the steps of:
    a) contacting the surface of the second substrate with a reactant selected to be chemically inert to the second set of molecules and to degrade at least the surface layer of the second substrate, thereby degrading the portion of the surface of the second substrate that is free of the second set of molecules; and
    b) removing the second set of molecules to uncover a portion of the surface of the second substrate.

5. The method of claim 3, further comprising the steps of:
    a) depositing a material on the portion of the second substrate surface that is free of the second set of molecules; and
    b) removing the second set of molecules to uncover a portion of the surface of the second substrate.

6. A method of forming a reproduction of a master, or portion thereof, comprising the steps of:
    a) providing a master that comprises a first set of molecules bound to a first substrate to form a pattern;
    b) assembling via bond formation a second set of molecules on the first set of molecules, wherein each molecule in the second set of molecules comprises:
        i) a reactive functional group; and
        ii) a recognition component that binds to the first set of molecules; and
        iii) optionally a covalent bond or a first spacer that links the reactive functional group to the recognition component;
    c) contacting the reactive functional group of the second set of molecules with a surface of a second substrate, thereby forming a bond between the second set of molecules and said surface of a second substrate such that the second set of molecules are attached to said surface of said second substrate by bonds that are stable to conditions that will break the bonds between the first and the second set of molecules;

d) breaking the bonds between the first set of molecules and the second set of molecules by using a solution having a high ionic strength thereby forming a complement image of the master;

e) assembling via bond formation a third set of molecules on the second set of molecules of the complement image, wherein each molecule in the third set of molecules consists of:
  i) a reactive functional group; and
  ii) a recognition component that binds to the second set of molecules; and
  iii) optionally a covalent bond or a first spacer that links the reactive functional group to the recognition component;

f) contacting the reactive functional group of the third set of molecules with a surface of a third substrate, thereby forming a bond between the third set of molecules and said surface of a third substrate such that the third set of molecules are attached to said surface of said third substrate by bonds that are stable to conditions that will break the bonds between the second and the third set of molecules;

g) breaking the bonds between the second set of molecules and the third set of molecules by using a solution having a high ionic strength thereby forming the reproduction of the master, or portion thereof; and h) optionally repeating steps e) through g) one or more times.

7. The method of claim 6, further comprising the steps of:
a) forming a pattern of one or more metal, metal oxide, or combinations thereof on a surface of a substrate using electron beam lithography;
b) contacting the surface with the first set of molecules, wherein each molecule of the first set of molecules has a reactive functional group that forms a bond between the metal or metal oxide and the molecules of the first set of molecules, thereby forming a master that comprises a first set of molecules bound to the substrate to form a pattern.

8. The method of claim 6, wherein at least one portion of the third substrate surface is free of the third set of molecules.

9. The method of claim 8, further comprising the steps of:
a) contacting the surface of the third substrate with a reactant selected to be chemically inert to the third set of molecules and to degrade at least the surface layer of the third substrate, thereby degrading the portion of the surface of the third substrate that is free of the third set of molecules; and
b) removing the third set of molecules to uncover a portion of the surface of the third substrate.

10. The method of claim 8, further comprising the steps of:
a) depositing a material on the portion of the third substrate surface that is free of the third set of molecules; and
b) removing the third set of molecules to uncover a portion of the surface of the third substrate.

11. A method of forming a complement image of a master, comprising the steps of:
a) providing a master that comprises a first set of molecules bound to a first substrate to form a pattern;
b) assembling via attractive forces or bond formation a second set of molecules on the first set of molecules, wherein each molecule in the second set of molecules consists of:
  i) a reactive functional group; and
  ii) a recognition component that is attracted to or binds to one or more of the first set of molecules; and
  iii) optionally a covalent bond or a first spacer that links the reactive functional group to the recognition component;
  iv) An exposed functionality selected from the group consisting of:
  antibody, antigen, hapten, enzyme, a substrate for an enzyme, inhibitor, co-factor, protein, lectin, carbohydrate, receptor, hormone, effector, repressor/inducer, or chemical groups such as —OH, —CONH—, —CONHCO—, —NH$_2$, —NH—, —COOH, —COOR, —CSNH—, —NO$_2^-$, —SO$_2$, —SH, —RCOR—, —RCSR—, —RSR, —ROR—, —PO$_4^{3-}$, —OSO$_3^{2-}$, —SO$_3^-$, —COO$^-$, —SOO$^-$, —RSOR—, —CONR$_2$, —(OCH$_2$CH$_2$)$_n$OH (wherein n =1-20, preferably 1-8), —CH$_3$, —PO$_3$H$^-$,-2-imidazole, —N(CH$_3$)$_2$, —N(R)$_2$, —PO$_3$H$_2$, —CN, —(CF$_2$)$_n$CF$_3$ (wherein n =1-20, preferably 1-8), an olefin;
  wherein R is hydrogen, a hydrocarbon, a halogenated hydrocarbon, a protein, an enzyme, a carbohydrates, a lectin, a hormone, a receptor, an antigen, an antibody, or a hapten;
  v) optionally a covalent bond or a second spacer that links the exposed functionality to the recognition component;

c) contacting the reactive functional group of the second set of molecules with a surface of a second substrate, thereby forming a bond between the second set of molecules and said surface of a second substrate such that the second set of molecules are attached to said surface of said second substrate by bonds that are stable to conditions that will break the bonds between the first and the second set of molecules;

d) breaking the attractive force or bonds between the first set of molecules and the second set of molecules by using a solution having a high ionic strength thereby forming a complement image of the master; and e) optionally repeating steps b) through d) one or more times.

12. A method of forming a reproduction of a master, or portion thereof, comprising the steps of:
c) providing a master that comprises a first set of molecules bound to a first substrate to form a pattern;
d) assembling via bond formation a second set of molecules on the first set of molecules, wherein each molecule in the second set of molecules consists of:
  i) a reactive functional group; and
  ii) a recognition component that binds to the first set of molecules; and
  iii) optionally a covalent bond or a first spacer that links the reactive functional group to the recognition component;
  iv) optionally an exposed functionality selected from the group consisting of: antibody, antigen, hapten, enzyme, a substrate for an enzyme, inhibitor, co-factor, protein, lectin, carbohydrate, receptor, hormone, effector, repressor/inducer, or chemical groups such as —OH, —CONH—, —CONHCO—, —NH$_2$, —NH—, —COOH, —COOR, —CSNH—, —NO$_2^-$, —SO$_2$, —SH, —RCOR—, —RCSR—, —RSR, —ROR—, —PO$_4^{3-}$, —OSO$_3^{2-}$, —SO$_3^-$, —COO$^-$, —SOO$^-$, —RSOR—, —CONR$_2$, —(OCH$_2$CH$_2$)$_n$OH (wherein n =1-20, preferably 1-8), —CH$_3$, —$PO_3H^-$, -2-imidazole, —$N(CH_3)_2$, —$N(R)_2$, —$PO_3H_2$, —CN, —$(CF_2)_nCF_3$ (wherein n =1-20, preferably 1-8), an olefin;

wherein R is hydrogen, a hydrocarbon, a halogenated hydrocarbon, a protein, an enzyme, a carbohydrates, a lectin, a hormone, a receptor, an antigen, an antibody, or a hapten;

v) optionally a covalent bond or a second spacer that links the exposed functionality to the recognition component;

c) contacting the reactive functional group of the second set of molecules with a surface of a second substrate, thereby forming a bond between the second set of molecules and said surface of a second substrate such that the second set of molecules are attached to said surface of said second substrate by bonds that are stable to conditions that will break the bonds between the first and the second set of molecules;

f) breaking the bonds between the first set of molecules and the second set of molecules by using a solution having a high ionic strength thereby forming a complement image of the master;

g) assembling via bond formation a third set of molecules on the second set of molecules of the complement image, wherein each molecule in the third set of molecules consists of:

i) a reactive functional group; and ii) a recognition component that binds to the second set of molecules; and iii) optionally a covalent bond or a first spacer that links the reactive functional group to the recognition component;

iv) An exposed functionality selected from the group consisting of:

antibody, antigen, hapten, enzyme, a substrate for an enzyme, inhibitor, co-factor, protein, lectin, carbohydrate, receptor, hormone, effector, repressor/inducer, or chemical groups such as —OH, —CONH—, —CONHCO—, —$NH_2$, —NH—, —COOH, —COOR, —CSNH—, —$NO_2^-$, —$SO_2$, —SH, —RCOR—, —RCSR—, —RSR, —ROR—, —$PO_4^{3-}$, —$OSO_3^{2-}$, —$SO_3^-$, —$COO^-$, —$SOO^-$, —RSOR—, —$CONR_2$, —$(OCH_2CH_2)_nOH$ (wherein n =1-20, preferably 1-8), —$CH_3$, —$PO_3H^-$, -2-imidazole, —$N(CH_3)_2$, —$N(R)_2$, —$PO_3H_2$, —CN, —$(CF_2)_nCF_3$ (wherein n =1-20, preferably 1-8), an olefin;

wherein R is hydrogen, a hydrocarbon, a halogenated hydrocarbon, a protein, an enzyme, a carbohydrates, a lectin, a hormone, a receptor, an antigen, an antibody, or a hapten;

v) optionally a covalent bond or a second spacer that links the exposed functionality to the recognition component;

f) contacting the reactive functional group of the third set of molecules with a surface of a third substrate, thereby forming a bond between the third set of molecules and said surface of a third substrate such that the third set of molecules are attached to said surface of said third substrate by bonds that are stable to conditions that will break the bonds between the second and the third set of molecules;

g) breaking the bonds between the second set of molecules and the third set of molecules by using a solution having a high ionic strength thereby forming the reproduction of the master, or portion thereof; and h) optionally repeating steps e) through g) one or more times.

* * * * *

UNITED STATES PATENT AND TRADEMARK OFFICE
CERTIFICATE OF CORRECTION

PATENT NO. : 7,862,849 B2
APPLICATION NO. : 10/688867
DATED : January 4, 2011
INVENTOR(S) : Francesco Stellacci et al.

Page 1 of 1

It is certified that error appears in the above-identified patent and that said Letters Patent is hereby corrected as shown below:

Please delete the paragraph titled 'GOVERNMENT INTEREST STATEMENT' encompassing column 1, lines 5-8:

"This invention wad made in whole or in part with government support under grant number DMI-0303821, awarded by the National Science Foundation. The government may have certain rights in the invention."

and replace with:

--This invention was made with government support under Grant No. DMI0303821 awarded by the National Science Foundation. The government has certain rights in this invention.--

Signed and Sealed this
Sixteenth Day of October, 2012

David J. Kappos
*Director of the United States Patent and Trademark Office*